United States Patent
Bihlmaier et al.

(10) Patent No.: US 10,921,867 B2
(45) Date of Patent: Feb. 16, 2021

(54) FIELD DEVICE OF MODULAR CONSTRUCTION

(71) Applicant: Robodev GmbH, Karlsruhe (DE)

(72) Inventors: Andreas Bihlmaier, Karlsruhe (DE); Julien Mintenbeck, Karlsruhe (DE); Jens Liedke, Karlsruhe (DE)

(73) Assignee: Robodev GmbH, Karlsruhe (DE)

( * ) Notice: Subject to any disclaimer, the term of this patent is extended or adjusted under 35 U.S.C. 154(b) by 0 days.

(21) Appl. No.: 16/605,532

(22) PCT Filed: May 17, 2018

(86) PCT No.: PCT/DE2018/100478
§ 371 (c)(1),
(2) Date: Oct. 16, 2019

(87) PCT Pub. No.: WO2018/219400
PCT Pub. Date: Dec. 6, 2018

(65) Prior Publication Data
US 2020/0125147 A1 Apr. 23, 2020

(30) Foreign Application Priority Data
May 31, 2017 (DE) ...................... 10 2017 111 998.1

(51) Int. Cl.
*G06F 1/18* (2006.01)
*G06F 1/20* (2006.01)
(Continued)

(52) U.S. Cl.
CPC ........... *G06F 1/181* (2013.01); *G01D 11/245* (2013.01); *G06F 1/20* (2013.01); *H04L 12/10* (2013.01);
(Continued)

(58) Field of Classification Search
CPC .......... G06F 1/181; G06F 1/20; H04L 12/10; H05K 5/03; H05K 7/1462; H05K 7/1465; G01D 11/245; G01D 21/00
(Continued)

(56) References Cited

U.S. PATENT DOCUMENTS 4,656,559 A * 4/1987 Fathi .................. H05K 7/20409
361/721
7,825,761 B2 11/2010 Scholz et al.
(Continued)

FOREIGN PATENT DOCUMENTS

CN 1450433 A * 10/2003 ......... F28D 15/0275
DE 10 2006 019 555 B3 11/2007
(Continued)

OTHER PUBLICATIONS

Lee; Sang-Cheol, "Chipset cooling device of video graphic adapter card", Oct. 22, 2003, Zalamn Tech Co LTD, Entire Document (Translation of CN 1450433) (Year: 2003).*

(Continued)

*Primary Examiner* — Stephen S Sul
(74) *Attorney, Agent, or Firm* — Collard & Roe, P.C.

(57) ABSTRACT

A field device for automation technology is accommodated in a housing which is produced from a polygonal profile and, for its part, is closed by a base plate and a cover plate. A base module is connected to the base plate, the base module being provided in a manner designed in the same way in all devices of a field bus, in order to manage the tasks of voltage supply and network connection. A functional module, which is optionally connected to the cover plate, provides the field device with one or more specific functionalities, and therefore configures the field device in a specific direction. This results in a unit of modular construction which, together with other identical field devices of different configuration, (Continued)

Figure 1:
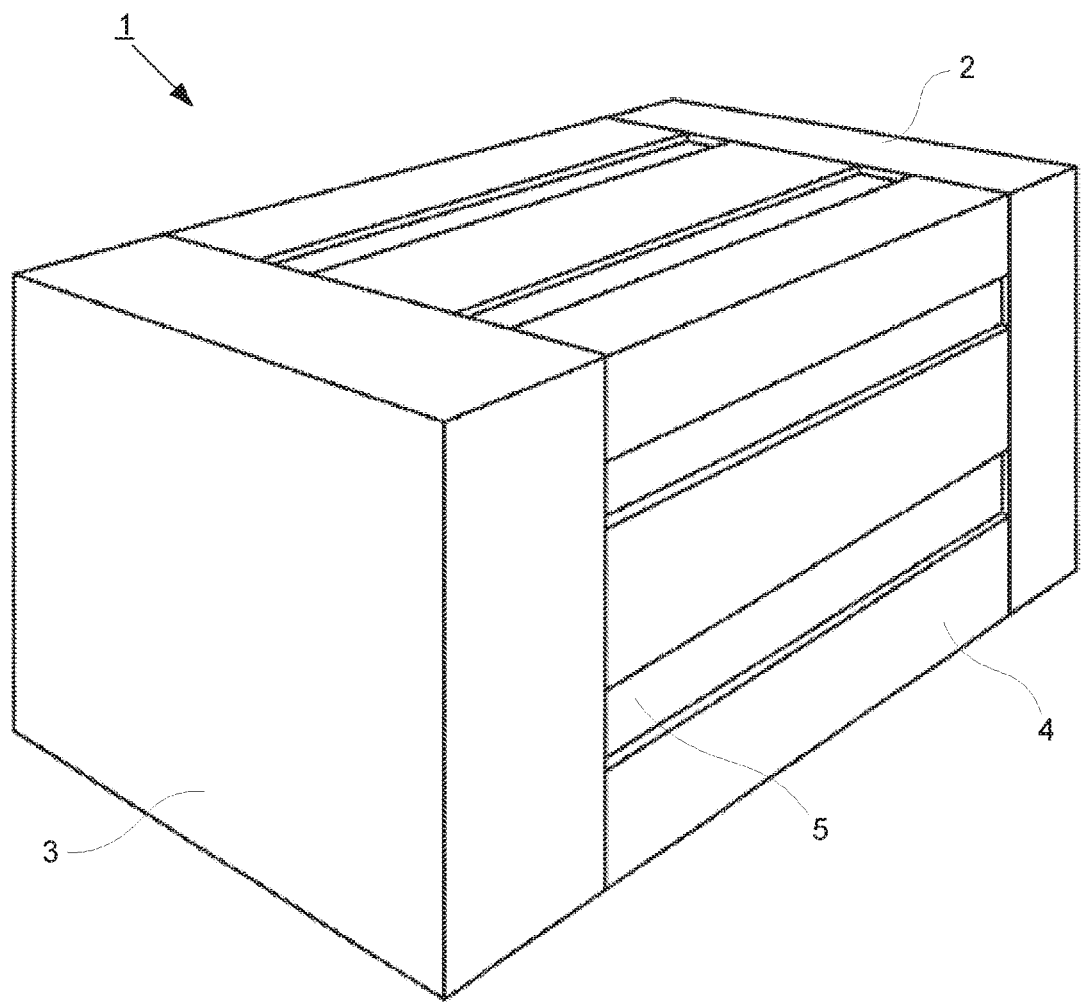

can be joined in accordance with the construction kit principle to form an automation system.

4 Claims, 4 Drawing Sheets

(51) Int. Cl.
    *H04L 12/10*     (2006.01)
    *H05K 5/03*     (2006.01)
    *H05K 7/14*     (2006.01)
    *G01D 11/24*     (2006.01)

(52) U.S. Cl.
    CPC ............. *H05K 5/03* (2013.01); *H05K 7/1462* (2013.01); *H05K 7/1465* (2013.01)

(58) Field of Classification Search
USPC ... 361/600, 679.02, 709, 720, 728, 730, 752
See application file for complete search history.

(56) References Cited

U.S. PATENT DOCUMENTS

| | | | | |
|---|---|---|---|---|
| 8,674,823 | B1* | 3/2014 | Contario | G01R 19/145 340/538 |
| 10,327,363 | B2 | 6/2019 | Michalski et al. | |
| 2003/0011988 | A1* | 1/2003 | Irmer | H02B 1/50 361/690 |
| 2005/0288799 | A1 | 12/2005 | Brewer et al. | |
| 2006/0232940 | A1 | 10/2006 | Smirra et al. | |
| 2007/0057783 | A1 | 3/2007 | Reller | |
| 2007/0058666 | A1* | 3/2007 | Pratt | H04L 12/4625 370/463 |
| 2012/0224337 | A1* | 9/2012 | Bodine | H04B 1/38 361/752 |
| 2015/0003032 | A1* | 1/2015 | Edwards | H05K 9/0052 361/818 |
| 2015/0154136 | A1* | 6/2015 | Markovic | H04L 12/6418 710/317 |
| 2015/0312048 | A1* | 10/2015 | Bodo | H04L 12/10 713/300 |
| 2016/0095235 | A1* | 3/2016 | Yang | H05K 5/0039 361/759 |
| 2016/0273722 | A1* | 9/2016 | Crenshaw | H05B 47/185 |
| 2018/0027681 | A1* | 1/2018 | Davis | H05K 7/1498 361/679.31 |
| 2018/0107610 | A1* | 4/2018 | Boettner | G06F 13/107 |

FOREIGN PATENT DOCUMENTS

| | | |
|---|---|---|
| DE | 10 2014 109 783 A1 | 1/2016 |
| DE | 10 2015 107 306 A1 | 11/2016 |
| EP | 0 902 346 A2 | 3/1999 |

OTHER PUBLICATIONS

English Translation of the International Search Report in PCT/DE2018/100478, dated Sep. 6, 2018. (Year: 2018).*

International Search Report in PCT/DE2018/100478, dated Sep. 6, 2018.

* cited by examiner

FIELD DEVICE OF MODULAR CONSTRUCTION

CROSS REFERENCE TO RELATED APPLICATIONS

This application is the National Stage of PCT/DE2018/100478 filed on May 17, 2018, which claims priority under 35 U.S.C. § 119 of German Application No. 10 2017 111 998.1 filed on May 31, 2017, the disclosure of which is incorporated by reference. The international application under PCT article 21(2) was not published in English.

The present invention relates to a field device of modular construction for operation on a field bus, comprising a housing with a base module which has a computing unit for process control, a communication interface data-connected to the computing unit for connection to a local communication network and an electrical interface electrically connected to a power supply of the computing unit for connection to a local voltage network.

Such a field device is already known from US 2007/0057783 A1. From this specification a field device for operation on a field bus is already known, comprising a housing with a base module, which has a computer unit for process control, a communication interface connected to the computer unit for connection to a local communication network, and an interface electrically connected to the power supply of the computer unit, namely an Ethernet interface. The known base module has been designed in such a way that it can be combined with a variety of different functional modules. However, the field device, which is known from this prior art, is housed in its own, safe housing, i.e. explosion-proof.

In addition, a housing is already known from US 2006/0232940 A1 in this context, wherein this housing is designed in the form of a polygonal profile enclosing an inner cavity. A base module attached to a base plate projects end to end into this inner cavity in such a way that the said inner cavity is closed with the base plate.

Furthermore, a housing is also already known from DE 10 2014 109 783 A1 which is designed as a polygonal profile enclosing an inner cavity. A base module attached to a base plate protrudes into this inner cavity in such a way that the inner cavity is also closed with the said base plate.

Such field devices are already widely known and common in the prior art. In field operation, they record data and states, regulate or control processes and forward measurement results to process computers or process them directly. As a rule, they are specifically designed and prepared for their intended use in the field. For example, a camera is used for monitoring tasks, a sensor for temperature measurement and a control valve for hydraulic control tasks. Depending on the bus system used, these components often have to be specially prepared in order to be able to communicate via the bus.

It is also necessary to provide a voltage supply for the individual components on site, which can mean that a mains voltage is kept available at which a voltage transformer suitable for the requirements of each individual device is used. The individual devices are rarely interchangeable and in the event of a device failure, the complete device must be replaced by another one. However, the operator would like to avoid this for cost reasons alone, since he would otherwise be forced to keep a wide variety of devices in stock in case they might be needed.

In order to control processes within the automation environment, additional control units with microprocessors are usually required, which communicate with the process computer and convert its complex instructions into control commands for the individual field devices, as well as prepare the determined measured values for the process computer or combine them to more complex intermediate results the other way round.

Against this background, the present invention is based on the object of creating a modular field device that exhibits a high degree of modularization and makes it possible to fall back largely on standardized components. In this case, not only a technical interaction between the components should function, but also a spatial integration should take place in order to reduce the effort of the cabling as well as the logistic effort of the storage and provision as far as possible.

This is achieved by means of a field device in accordance with the features of claim 1. Further useful embodiments of such a field device can be found in the subclaims.

According to the invention, it is provided that a field device has a common housing in which all necessary components of the field device can be accommodated. For this purpose it is provided that such a field device has a base module to which a computing unit, a communication unit and a power supply are assigned. Each field device is equipped with such a base module so that both communication via the field bus and the power supply are ensured and the device is addressed and can transmit data. On this basis, the invention provides that the construction principle of such a field device is based on a housing made of a polygonal profile, which can be closed from two sides when empty. The base module is thus designed in such a way that it is mounted on a base plate which is inserted into the polygonal profile from one side and closes it at the same time. It is understood that the base plate can be penetrated by connections, inspection and communication windows of any kind, but the base module is always constructed in the same way and always on the base plate adapted to the shape of the polygonal profile. In this configuration, the computing unit is already available for tasks from the automation environment. This uniform configuration of such a polygonal profile with the base modules which create a uniform communication platform and guarantee a uniform power supply ensures that all field devices have the same base and that only uniform components need to be replaced in the event of failures. Special devices can thus be dispensed with. A specialization of the basic field devices, which until then had been limited to pure computing tasks, can be carried out as required by adding functional modules. These functional modules comprise functional units of the most varied types, which are inserted into the polygonal profile on a cover plate, complementary to the base plate, on the still free side of the polygonal profile and thus completely close the polygonal profile. When the functional module is inserted into the polygonal profile, the functional unit is connected to the power supply of the base module and a data connection is established with the computing unit via which the computing unit can control the functional unit. Analogous to the base plate, the cover plate may also be penetrated by the at least one functional element, have windows or openings through which the functional element can act, or have suitable adapters, connections, flanges and more, depending entirely on the type and functionality of the at least one functional element.

In detail, such a functional element can be a motor, a sensor or a sensor arrangement, a lighting element, a camera, a working machine, an input element, a display or a loudspeaker. Any other functional elements or combinations thereof are conceivable and covered by the invention.

In order to control the field bus and feed in the voltage, as well as to enable communication with devices outside a local communication network, for example via the Internet, a type of head-end station is required which, in addition to the base module, also has a network interface connected to the computing unit for connection to this external communication network. In this context, the head-end station represents the gateway to the external network and can control and restrict the communication between external devices and the individual field devices as required. It also connects a public power network to the internal voltage network of the field devices via the mains connection electrically connected to the power supply of the computing unit, so that a common network voltage is available to these devices. The voltage on the internal voltage network is specified via a voltage transformer, which is connected between the mains connection of the head-end station and the voltage supply of the computing unit.

With some advantage, the housing is an elongated polygonal profile, preferably a triangular or square profile, which preferably also has at least one undercut longitudinal groove on its circumferential wall. A slot nut can be inserted into this to fasten the field device to a supporting device. A screw can be screwed into the slot nut and the housing can be fixed to the supporting device, for example in the form of a supporting profile, a cross beam or a stand frame.

However, the solution according to the invention also has some advantages with regard to cooling. First, low voltages of preferably 48 volts are used in the base module or the functional module, at least one voltage level in the range of the lowest voltage, so that the heat development is comparatively small. In addition, microprocessors can then be used that are energy-efficient and therefore have only low power consumption and space requirements and therefore produce little waste heat. The waste heat that is nevertheless produced can be dissipated into the housing by contacting a hot side of the microprocessor on the base plate or the cover plate, preferably with an intermediate layer of a heat-conducting layer. The cover plate and/or the base plate are made of a thermally conductive material, preferably metal and most preferably aluminum or copper. In addition, the base plate and/or the cover plate can also be heat-conductively connected to the polygonal profile, which is also heat-conductive, so that its outer surface is also available for cooling the processors. Screws with which the cover plate and/or the base plate are connected to the polygonal profile can in particular dissipate the heat from these plates into the polygonal profile.

Alternatively, the waste heat from the processor can also be dissipated in the reverse direction. If a heat transfer, for example in the form of a thermally conductive material section, is arranged on the inner wall of the polygonal profile and the hot side of the processor contacts this heat transfer, the heat can first flow off into the polygonal profile and, if necessary, also via the screws into the base plate and/or the cover plate.

The Ethernet POWERLINK protocol or another Ethernet-based real-time protocol is preferred for communication in the automation environment. With regard to the local, internal voltage network, a low-voltage network is preferably used. If necessary, the corresponding interfaces of the base module can be combined to form a hybrid interface, wherein a familiar protocol such as Power-over-Ethernet (PoE) can also be used.

Figure 2:
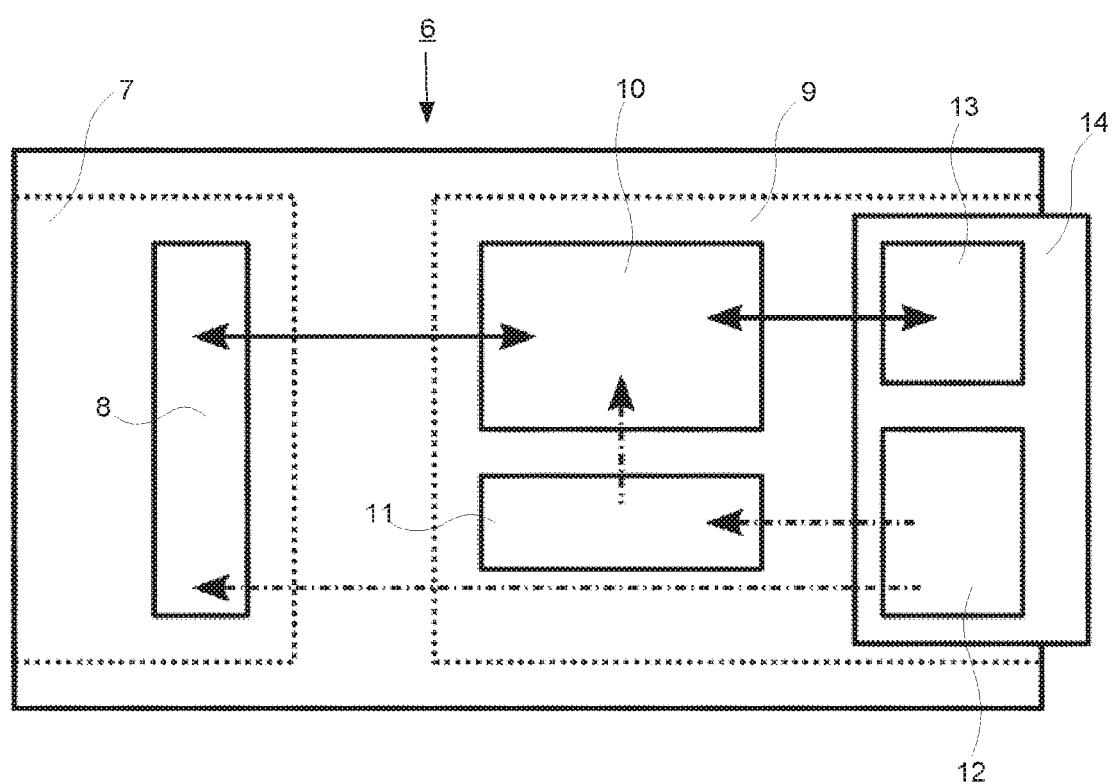
Figure 3:
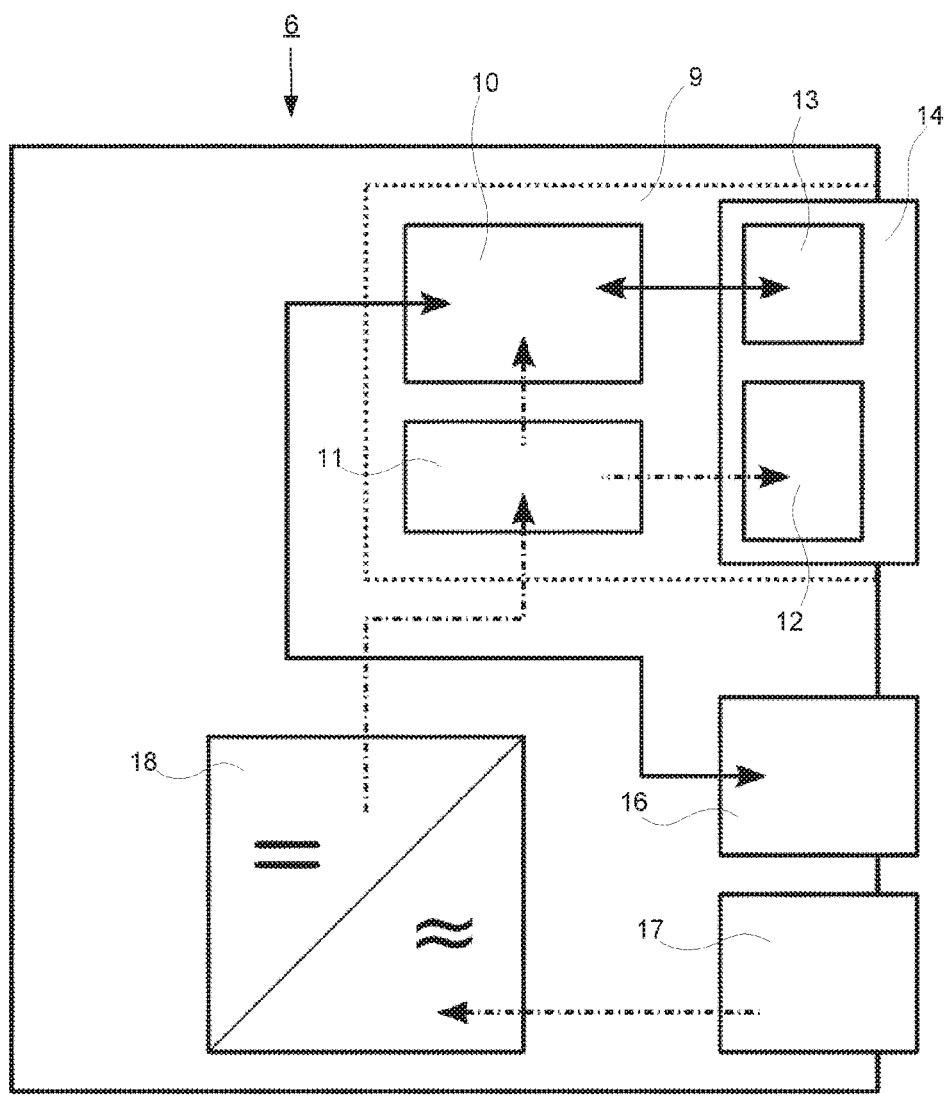
Figure 4:
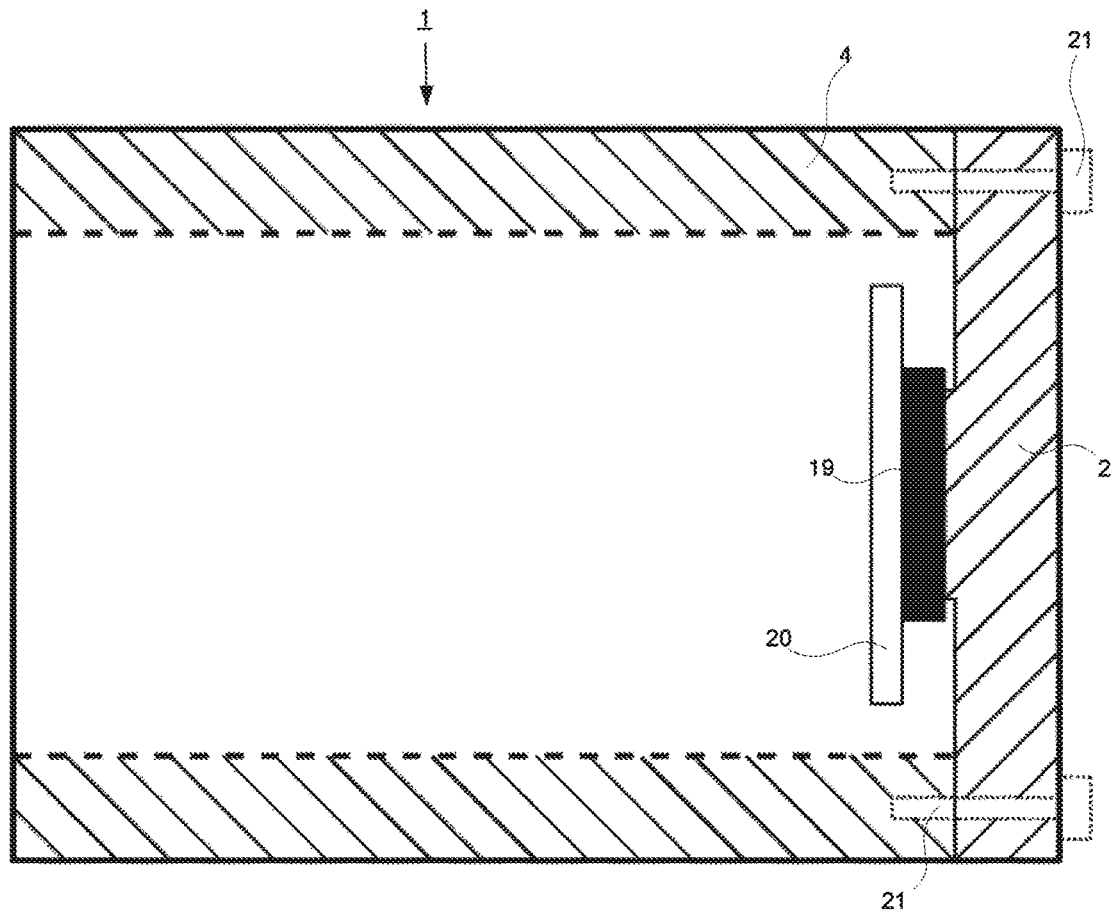
Figure 5:
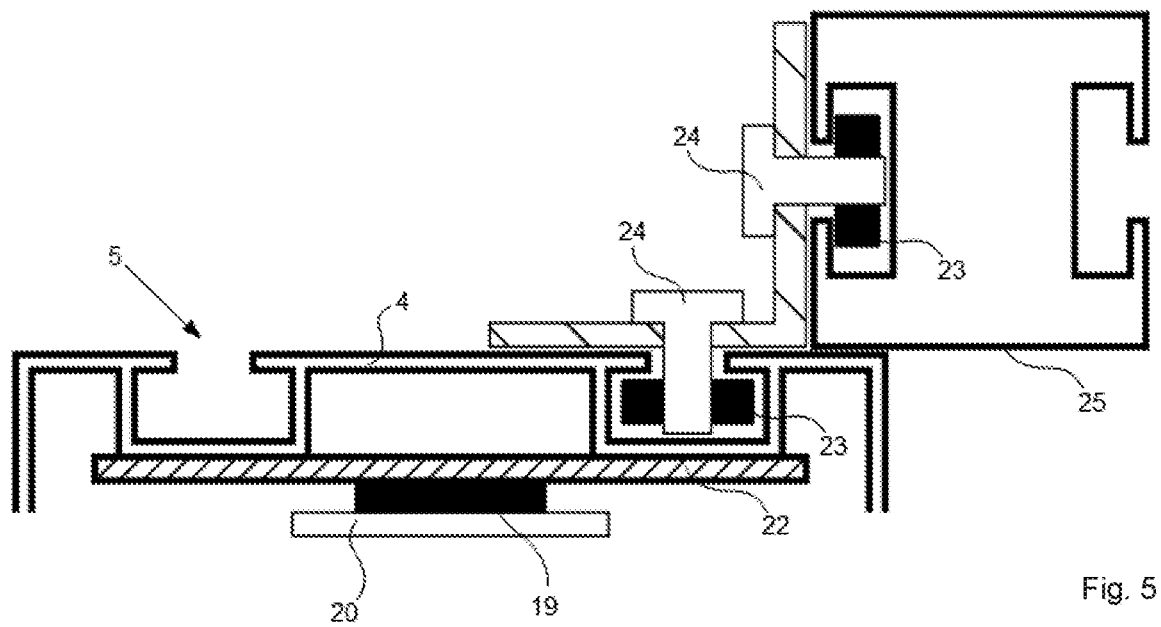

The invention described above is explained in more detail below using an embodiment example, wherein:

FIG. 1 shows a field device according to the invention in a perspective representation from diagonally above, FIG. 2 shows a lateral cross-section of the field device according to FIG. 1 in a schematic block diagram, FIG. 3 shows a variant of the field device according to FIG. 5 in a schematic block diagram, FIG. 4 shows a detail of a lateral cross section of the field device according to FIG. 1, as well as FIG. 5 shows a detail of a cross-sectional plan view of the field device according to FIG. 1.

FIG. 1 shows a field device 6 arranged in a modularly designed housing 1. The housing 1 essentially consists of an elongated square profile 4, which has two undercut longitudinal grooves 5 on each of its side faces for mounting on a supporting structure which is not shown here and is of no further interest. The square profile 4 is terminated at both ends by means of plates carrying the functional elements 8 realized in the field device 6 and the elements of a base module 9. It consists of a base plate 2, which carries the base module 9, and a cover plate 3, on which a functional module 7 with at least one functional element 8 is arranged.

FIG. 2 schematically shows the internal structure of the field device 6. From the left side, the functional module 7 with the functional elements 8 mounted on the cover plate 3, for example a lamp, is inserted into the square profile, while the base module 9 is inserted from the right side. The base module 9, which is present in each field device, first and foremost comprises a computing unit 10, which exchanges data with the at least one functional element 8 via a wired or a wireless connection. The computing unit 10 is supplied by a voltage supply 11 with a low voltage of 48 volts, which is applied via an electrical interface 12, within a hybrid interface 14. The electrical interface 12 also supplies at least one functional element 8 of functional module 7. In addition to this electrical interface 12, hybrid interface 14 also comprises a communication interface 13, with which data can be exchanged between the field devices within the local network of the automation environment.

FIG. 3 describes a variant of the field device described above, which represents a head-end station with respect to the automation environment. This does not include a functional module 8 but in addition a network interface 16 and a mains connection 17. Via the mains connection 17, a mains voltage of 220 volts is applied to a voltage converter 18, which converts the applied alternating voltage of 220 volts, or in the USA 110 volts, into a direct voltage of 48 volts. This 48 volt DC voltage is applied to the voltage supply 11 of the computing unit 10 and is also fed into the electrical interface 12, which is also provided in the already known base module 9 also present here.

In addition, the computing unit 10 communicates with the network interface 16 and receives requests from an external network, such as the Internet, and sends data packets out of the internal network.

FIG. 4 shows another aspect of the invention in a detailed section of a cross-section through the housing 1. A microprocessor 19 mounted on a printed circuit board 20, which implements a computing unit 10 of FIG. 2, is attached to the base plate 2 via a heat-conducting contact and conducts waste heat directly into the base plate 2 via its hot side.

The base plate itself is connected to the square profile 4 of housing 1 via heat transfers 21, here designed as screws, so that heat can also be transferred from base plate 2 to the square profile. The affected housing parts 2 and 4 are made of a thermally conductive material.

FIG. 5 shows an alternative to the previous FIG. 4, in which the microprocessor 19 mounted on a printed circuit board 20 contacts the square profile 4 directly via a heat transfer 21 in the form of a heat conducting plate, more precisely on the back of the longitudinal grooves 5. This means that the heat is introduced directly into the square profile 4 and distributed there so that a large surface is available for dissipation. Furthermore, the heat can also be dissipated in the opposite way via the mounting screws into the cover plate 3 and/or the base plate 2.

As shown in FIG. 5, profile 4 also has at least one undercut longitudinal groove 5 on its circumferential wall. A slot nut 23 can be inserted into this to fasten the field device 6 (shown in FIGS. 2 and 3) to a supporting device 25. A screw 24 can be screwed into the slot nut 23 and the housing 1 can be fixed to the supporting device 25. The waste heat that is produced can be dissipated into the housing 1 by contacting a hot side of the microprocessor 19 on the base plate 2 or the cover plate 3, preferably with a heat-conducting layer 22.

The above describes a modular field device which, due to the design of its housing in a polygonal profile, has a high degree of modularization and makes it possible to fall back largely on standardized components in the form of a base module and variable functional modules.

LIST OF REFERENCE NUMBERS

1 Housing
2 Base plate
3 Cover plate
4 Square profile
5 Longitudinal groove
6 Field device
7 Functional module
8 Functional unit
9 Base module
10 Computing unit
11 Power supply
12 Electrical interface
13 Communication interface
14 Hybrid interface
15 Head-end station
16 Network interface
17 Mains connection
18 Voltage transformers
19 Microprocessor
20 Printed circuit board
21 Heat transfer
22 Heat-conducting layer
23 Slot nut
24 Screw
25 Supporting device

The invention claimed is:

1. A modular field device for operation on a field bus, comprising: a housing (1) with a base module (9) which has a computing unit (10) for process control;
   a communication interface (13), which is data-connected to the computing unit (10), for connection to a local communication network of an automation environment of the modular field device; and
   an electrical interface (12), which is electrically connected to a voltage supply (11) of the computing unit (10), for connection to a local voltage network;
   wherein a functional module (7) is assigned to the housing (1), which has at least one functional element (8) which is data-connected to the computing unit (10) and electrically connected to the electrical interface (12), so that both communication via the field bus and the voltage supply of the computing unit (10) is ensured;
   wherein the functional element (8) is a motor, a sensor or a sensor arrangement, a lighting element, a camera, a working machine, an input element, a display or a loudspeaker; and
   wherein the communication interface (13), which is data-connected to the computing unit (10), for connection to the local communication network and the electrical interface (12), which is electrically connected to a voltage supply (11) of the computing unit (10), for connection to the local voltage network are combined in a common hybrid interface (14);
   wherein the housing (1) is designed as an elongated polygonal profile (4) which surrounds an inner cavity and into the inner cavity of which the base module (9), which is fastened to a base plate (2), projects at its end and closes said base module (9) by means of the base plate (2);
   wherein the functional element (8) is fastened to a cover plate (3);
   wherein the functional module (7) projects at its end into the inner cavity of the polygonal profile (4) and closes said polygonal profile (4) by means of the cover plate (3); and
   wherein the polygonal profile (4) has on its circumferential wall at least one undercut longitudinal groove (5) into which a slot nut (23) can be inserted for fastening the modular field device to a supporting device (25), wherein a screw (24) can be screwed into the slot nut (23) and the housing can be fixed to the supporting device (25).

2. The modular field device according to claim 1, wherein the housing (1) has a network interface (16), which is data-connected to the computing unit (10), for connection to an external communication network, and a mains connection (17), which is electrically connected to the voltage supply (11) of the computing unit (10), for connection to an external voltage network; and
   wherein a voltage converter (18) is electrically connected between the mains connection (17) and the voltage supply (11) of the computing unit (10).

3. The modular field device according to claim 1, wherein a microprocessor (19) of the base module (9) is thermally connected to the base plate (2) and/or the cover plate (3), and the base plate (2) and/or the cover plate (3) in turn is thermally conductively connected to the polygonal profile (4).

4. The modular field device according to claim 1, wherein the housing (1) is assigned a microprocessor (19) which is connected to the polygonal profile (4) with the interposition of a heat-conducting layer (22).

* * * * *